United States Patent [19]

Kadakia et al.

[11] 4,327,379

[45] Apr. 27, 1982

[54] HARDWARE IMPLEMENTATION OF 4-PIXEL CODE ENCODER

[75] Inventors: Vinod K. Kadakia, Torrance; Glen D. Jones, Orange; Kedar D. Parikh, Seal Beach; Ronald E. Rider, Palos Verdes Estates, all of Calif.

[73] Assignee: Xerox Corporation, Stamford, Conn.

[21] Appl. No.: 139,501

[22] Filed: Apr. 11, 1980

[51] Int. Cl.$^3$ .............................................. H04N 1/40
[52] U.S. Cl. ............................. 358/261; 340/347 DD
[58] Field of Search ................... 358/260, 261; 375/28; 340/347 DD

[56] References Cited

U.S. PATENT DOCUMENTS 3,588,329  6/1971  Monk ..................................... 375/28

Primary Examiner—Howard Britton
Attorney, Agent, or Firm—Robert E. Cunha

[57] ABSTRACT

A circuit to encode image data. The circuit receives image data in four bit nibbles which are either all-zero nibbles or terminating nibbles containing at least one non-zero bit. The circuit output is a series of code words, each a multiple of four bits and up to twenty-four bits long, packed into eight bit output words. Each code word contains a first part containing a run length specifying the number of received all-zero nibbles and a second part specifying the bit pattern of the terminating nibble. The circuit uses PROMs for the look-up and control elements and a pipeline of registers to allow high speed operation.

10 Claims, 14 Drawing Figures

| CODE TYPE | | | ASSIGNMENT | |
|---|---|---|---|---|
| TYPE 1 | `10# #`<br>X∈A, Y=0 | | # # =00<br>=01<br>=10<br>=11 | X = 1000<br>= 0100<br>= 0010<br>= 0001 |
| TYPE 2<br>2A | `000000 # #`<br>CONTROL CODES | | # # =00<br>=01<br>=10<br>=11<br>01110000<br>01110001 | RAW (RAW IMAGE DATA)<br>NOL (NORMAL END OF LINE)<br>PBK (PREDICTION BREAK)<br>RPT (REPEAT PREVIOUS LINE)<br>OPTIONAL SOP (START OF PAGE)<br>OPTIONAL EOP (END OF PAGE) |
| 2B | `0nnnnn # #`<br>X∈A<br>1≤Y≤25 | | # # =00<br>=01<br>=10<br>=11 | X = 1000<br>= 0100<br>= 0010<br>= 0001 |
| 2C | `011bbbbz`<br>X∈B<br>Y=0,1 | | nnnnn<br>z=0→Y=0, z=1→Y=1<br>bbbb = EXACT BIT PATTERN OF CLASS B<br>TERMINATOR EXCEPT THE FOLLOWING<br>X = 0011* → bbbb = 0100 | 5 BITS REPRESENTATION OF Y |
| TYPE 3 | `11nnnnnnbbbb` | | bbbb = CLASS A OR CLASS B TERMINATOR | |
| 3A1<br>3A2 | X∈A, 26≤Y≤63<br>X∈B, 2≤Y≤63 | | nnnnnn = BINARY REPRESENTATION OF Y | |
| 3B | `11nnnnnn0000`<br>64×N, 1≤N≤63 | | nnnnnn = MULTIPLE OF 64 ZERO NIBBLES | |

| CODE TYPE | | ASSIGNMENT | |
|---|---|---|---|
| TYPE 1 | `10 # #`<br>X∈A, Y=0 | # # = 00<br>= 01<br>= 10<br>= 11 | X = 1000<br>= 0100<br>= 0010<br>= 0001 |
| TYPE 2 | | | |
| 2A | `000000 # #`<br>CONTROL CODES | # # = 00<br>= 01<br>= 10<br>= 11<br>01110000<br>01110001 | RAW (RAW IMAGE DATA)<br>NOL (NORMAL END OF LINE)<br>PBK (PREDICTION BREAK)<br>RPT (REPEAT PREVIOUS LINE)<br>OPTIONAL SOP (START OF PAGE)<br>OPTIONAL EOP (END OF PAGE) |
| 2B | `0nnnnn # #`<br>X∈A<br>1≤Y≤25 | # # = 00<br>= 01<br>= 10<br>= 11 | X = 1000<br>= 0100<br>= 0010<br>= 0001 |
| 2C | `011bbbbz`<br>X∈B<br>Y=0,1 | nnnnn<br>z=0 → Y=0,  z=1 → Y=1<br>bbbb = EXACT BIT PATTERN OF CLASS B<br>TERMINATOR EXCEPT THE FOLLOWING<br>X = 0011 * → bbbb = 0100 | 5 BITS REPRESENTATION OF Y |
| TYPE 3 | | | |
| | `11nnnnnnbbbb` | bbbb = CLASS A OR CLASS B TERMINATOR | |
| 3A1<br>3A2 | X∈A, 26≤Y≤63<br>X∈B, 2≤Y≤63 | nnnnnn = BINARY REPRESENTATION OF Y | |
| 3B | `11nnnnnn0000`<br>64×N, 1≤N≤63 | nnnnnn = MULTIPLE OF 64 ZERO NIBBLES | |

*FIG. 1A*

TYPE A TERMINATOR (0001,0010,0100,1000)
TYPE B TERMINATOR (NOT A, NOT 0000)
| Y | X |  NIBBLE RUN-LENGTH FORMAT
A NIBBLE RUN LENGTH IS Y ZERO NIBBLES (0000) TERMINATED BY AN X NIBBLE
WHERE X∈A OR X∈B, Y IS ALWAYS INTEGER MULTIPLE OF (0000)
IF Y IS GREATER THAN OR EQUAL TO 64, THEN Y=64×N+Y'
Y IS CODED BY N BLOCKS OF 64 AND THE REMAINDER Y' CODED AS ABOVE
*FIG. 1B*
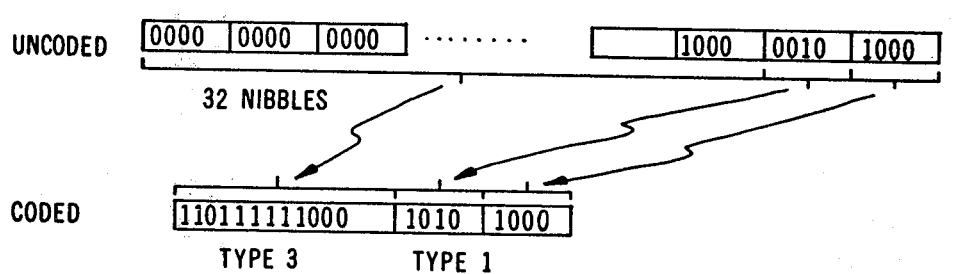
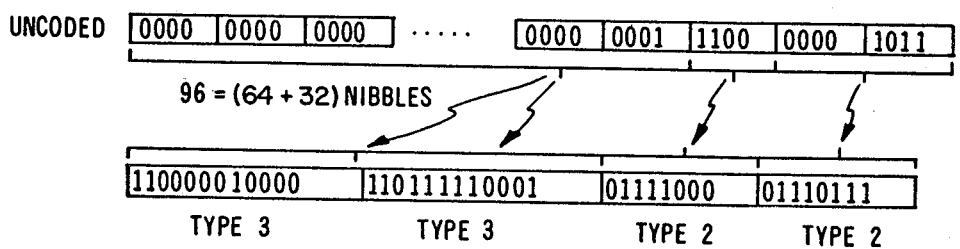
*FIG. 2*

MULTIPLEX CONTROL SEQUENCING

| CONDITIONS | | | MULTIPLEX SEQUENCE | * TYPE |
|---|---|---|---|---|
| MSB ZERO | X∈A | Y = 0 | 3 N N N N N | 1 |
| | | 1 < Y < 25 | 3 4 N N N N | 2B |
| | | 26 < Y < 63 | 3 4 5 N N N | 3A1 |
| | X∈B | Y = 0 or 1 | 3 4 N N N N | 2C |
| | | 2 < Y < 63 | 3 4 5 N N N | 3A2 |
| MSB NOT ZERO | X∈A | Y = 0 | 1 2 6 3 N N | 3B, 1 |
| | | 1 < Y < 25 | 1 2 6 3 4 N | 3B, 2B |
| | | 26 < Y < 63 | 1 2 6 3 4 5 | 3B, 3A1 |
| | X∈B | Y = 0 or 1 | 1 2 6 3 4 N | 3B, 2C |
| | | 2 < Y < 63 | 1 2 6 3 4 5 | 3B, 3A2 |

FIG. 5

HARDWARE IMPLEMENTATION OF 4-PIXEL CODE ENCODER

BACKGROUND OF THE INVENTION

This invention relates to the compression of binary data and more particularly to an improved run-length coding circuit.

There is a need in electronic systems for compacting data so that the information contained within said data may be stored in less memory or transmitted at a higher rate.

One technique is the use of a simple run-length code where the number of bits is transmitted rather than the bits themselves. In other words, the number "64" would be transmitted instead of the 64 bits.

A predictor may be used before the run-length encoder to increase the compression. A predictor examines the previous bits and then predicts the state of the instant bit. The prediction and the instant bit are then compared, a successful prediction being coded as a "0" bit, an unsuccessful prediction being coded as a "1" bit. A well designed predictor increases the average run length and, therefore, improves the efficiency of the encoder. In the system described herein a predictor is used ahead of the encoder but the claims are directed to the encoder alone since the encoder may be used with or without the predictor in any actual transmission or recording system.

A problem with a simple run-length encoder is that it must process each input bit as it is received. For example, after the reception of a string of 0's, the next bit must be inspected. If it is a 0, a run-length counter is incremented; if it is a one, the previous counter total is transmitted and the counter is initialized.

To speed up the data rate, the run-length encoder may be designed to process data bits in parallel. One example of this technique is described by John Monk in U.S. Pat. No. 3,588,329. The input bits are inspected in blocks of 64, 16 or 4 bits at a time and a variable length output word is produced containing the compressed data in the form of modified run-lengths.

The parallel processing of data in the form of data blocks increases the data rate, but ultimately a limit is reached based on the number of bits per block, which must be optimized for the particular application, and the circuit complexity, which must be minimized. An example of a commercially useful encoder is one that can operate in excess of 50 M bits per second in the compression of image data.

SUMMARY OF THE INVENTION

The circuit described herein receives the output of a predictor in the form of four-bit nibbles, and produces an encoded and compressed output of from four to twenty-four bits per word.

The encoder groups the input data into data words comprising an uninterrupted line of nibbles containing all 0's, regardless of how many that may be, followed by a terminating nibble having at least one 1 bit. A first code word portion is assigned to the number of all-zero nibbles, and a second code word portion is assigned to the data pattern of the terminating nibble. The final code word is the combination of the first and second code word portions. Finally, the code words are packed into eight bit output words prior to transmission.

The circuit uses a counter to count the number of all-zero nibbles, PROMs for table look-up and control functions, and several groups of registers formed into a pipeline to maintain a high data rate.

The object of the invention, therefore, is to provide a modified run-length encoding circuit which allows the efficient encoding/decoding of binary data at high rates. The described embodiment receives a four bit input and, in the worst case, produces an eight bit output for each 100 ns clock.

BRIEF DESCRIPTION OF THE DRAWINGS

FIG. 1A is a code assignment.

FIG. 1B is a set of definitions for the symbols used in FIG. 1A.

FIG. 2 comprises two examples of the encoding process.

FIG. 5 is a decision tree showing the multiplexer sequencing.

DETAILED DESCRIPTION OF THE DRAWINGS

Figure 3:
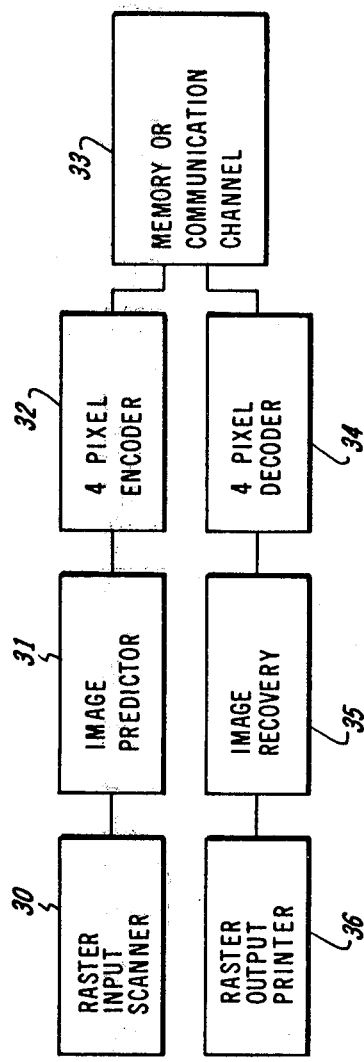
FIG. 3 is a block diagram of a system in which the invention may be used.

In the particular embodiment described herein, the specific rules for converting an input data string into coded words are illustrated in FIGS. 1A and 1B, and summarized in FIG. 5. An input data string is defined as a series of Y all-zero nibbles followed by one terminating nibble X that contains at least one 1 bit. As shown, a Type 1 output word has four bits, a Type 2 output word has eight bits and a Type 3 output word has twelve bits.

A Type 1 output word is generated if there are no leading all-zero nibbles (Y=0) and the terminating non-zero nibble, X, belongs to the set of A, where A=1000, 0100, 0010, 0001. If these conditions are satisfied (that is X$\epsilon$A, Y=0) then the output is in the form of 10## where the ## bits are assigned as shown in FIG. 1B.

If Y=0 or 1 and X is in the set of B, where the set of B is all four-bit combinations except A and all zeros, then a Type 2C output word will be produced. The output word will be in the form of 011bbbZ where bbbb is the actual four bit pattern of the terminating nibble, except that bbbb=0100 when X=0011. Finally, Z=Y.

If $1 \leq Y \leq 25$ and X is in the set of A, a Type 2B word of the form 0nnnnn## will be produced, where nnnnn is the five bit representation of Y, and ## are assigned as shown.

If X is in the set of A and $26 \leq Y \leq 63$, or if X is in the set of B and $2 \leq Y \leq 63$, then a Type 3A output word is produced of the form 11nnnnnnbbbb were nnnnnn is the binary representation of Y and bbbb is the pattern of bits in the terminating nibble.

The above rules apply where there is a maximum of 63 all-zero nibbles before the terminating nibble. If there are 64 or more all-zero nibbles before a non-zero terminating nibble, the data string is converted into a first part comprising a number of sets of 64 all-zero nibbles and a second part comprising the remaining 0 to 63 all-zero nibbles and the terminating nibble. The first part is encoded into a Type 3B output word of the form 11nnnnnn0000 where nnnnnn is the binary representation of the number of sets of 64 all-zero nibbles. The second set is then encoded according to the previously described rules.

These rules may be illustrated by way of the examples of FIG. 2. In Example 1, the first string comprises 31 all-zero nibbles and a terminating nibble of 1000. $X \epsilon A$ and $26 \leq Y \leq 63$ so a Type 3A output word is called for. In this case, 11,nnnnnn,bbbb=11,011111 (31 all-zero nibbles), 1000 (the actual bit pattern).

The next input word is 0010. $Y=0$ and $X \epsilon A$ so a Type 1 word is required. In this case $10\#\# = 1010$.

The last input word is a 1000 which is also in the set of A so the Type 1 output word, $10\#\#$, becomes 1000 as shown.

In example 2 of FIG. 2, the first input string has 95 zero nibbles and a terminating nibble of 0001 making a total of 96 nibbles. First the multiples of 64 zero nibbles are separated out. Here there is one group of 64 zero nibbles, so a Type 3B word is called for. 11nnnnnn0000=11,000001 (one set of 64 zero nibbles), 0000. Next, the remainder is encoded using the above described rules. There are 31 zero nibbles in the remainder and the termination nibble is of the set of A so a Type 3A output word will be produced. 11,nnnnnn,bbbb=11,011111 (31 zero nibbles), 0001.

The next input word is 1100 which is in the set of B, and $Y=0$. A type 2C word is required. 011,bbbb,Z=011,1100 (the actual pattern), 0 ($Y=0$).

The final input word is 0000 1011. Here, $Y=1$ and the terminator is the of the set of B so a Type 2C word is again required. 011,bbbb,Z=011,1011 (the actual pattern), 1($Y=1$).

FIG. 3 is a simplified block diagram of a typical image processing system for reading an image in binary form into and back from a communication channel or memory storage device 33.

The document is scanned by a raster input scanner 30 which transforms each scanned line of image into a series of binary bits representing black and white pixels. The majority of bits output are white or 0 bits since the scanned document usually is text. Next, the predictor 31 operates on the bit string, usually reducing further the number of 1 bits. Finally, the bit string is encoded using the rules stated above to compress the data prior to transmission or storage.

To read from the communication channel or memory 33 and print on paper, the reverse process is called for. A decoder 34 expands the coded words into bit strings, an image recovery circuit 35 or depredictor recreates the original bit string as it was produced by the raster input scanner 30, and the image is printed by the raster output printer 36.

Figure 4:
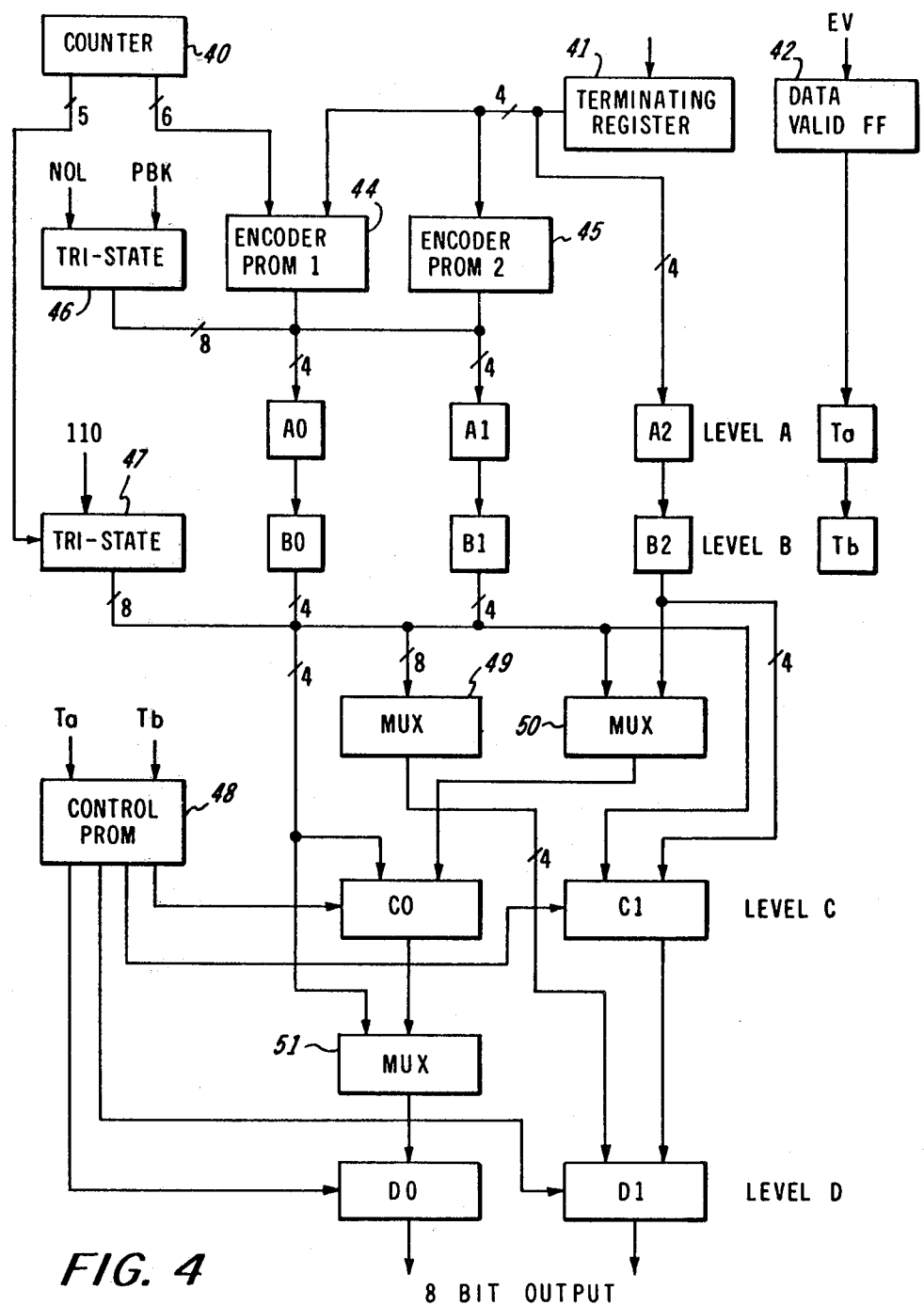
FIG. 4 is a block diagram of the encoding circuit.

FIG. 4 is a detailed block diagram of the circuit. The incoming image data, in the form of four bit nibbles are input to the eleven bit run length counter 40 which increments for each all-zero nibble received. An eleven bit counter was chosen to accommodate the count of a complete scan line of all-zero nibbles corresponding to an all-white scan. The input is also received at the terminating register 41 which controls the remaining circuitry if the received nibble is a terminating nibble. An additional input is the error valid (EV) bit input to data valid flip-flop 42. The error valid line going high indicates that the accompanying data word is a non-zero terminating nibble from the predictor.

During scan line operation, if the predictor correctly predicted all four bits of the nibble, the error valid signal will be low and the counter 40 is incremented. If the predictor failed to predict one or more of the four bits correctly, the error valid signal will be high. In either case, the circuit will address $1K \times 4$ bit PROMs 44 and 45 with the contents of register 41 and the least significant six bits of counter 40. The result is that if a four bit output word is appropriate, it will be contained in register A0; if an eight bit word is appropriate, it will be contained in registers A0 and A1; and if a twelve bit output word is appropriate, it will be contained in registers A0, A1 and A2.

In fact, registers A0, A1 and A2 will be loaded from PROMs 44 and 45 and register 41 whether the data is valid or not. The data will be valid if it was received with a high error valid bit. As the error data is shifted to "Level A", the error valid (EV) bit is shifted also, to flip-flop Ta, thus indicating that the Level A data is valid.

The control codes are also generated at Level A. For example, two control codes representing a normal end of line (NOL) and a prediction break (PBK) may be multiplexed into registers A0 and A1 through tri-state devices 46 as shown.

During the same cycle, if there is a non-zero terminator and the count is more than sixty-four, the five most significant bits of the counter 40 and some leading code bits (110) may be coupled through the tri-state devices 47 and multiplexers 49, 50 and 51 into registers C0, C1, D0 and D1. Thus, the code words produced as the result of the reception of one terminating nibble may be clocked into various registers at Levels A, C and D. During succeeding clock times, this data is then shifted down through the four level pipeline to emerge as eight bit output words.

The process is controlled by PROM 48 which receives input bits indicating the size and location of the various code word segments and controls the multiplexers 49, 50 and 51 so that these segments are shifted through the pipeline properly.

The function of the pipeline elements is most easily demonstrated by a discussion of the worst case where register D0 contains data from a previous cycle, the instant input nibble produces a twelve bit Type 3B run length and a twelve bit Type 3 A1 or 3 A2 terminating code word, and where the subsequent code word produced is an eight bit Type 2 word. The circuit must produce and output these code words in the correct sequence, compacted into eight bit output words, without the loss of data.

During the first clock period the five most significant bits of the counter 40 and three leading code bits (110) are coupled through the tri-state devices 47 and multiplexer 49 and loaded into registers D1 and C0, and register C1 is zeroed, to produce a twelve bit Type 3B code word at Levels C and D.

At the same time a twelve bit Type 3 A1 or 3 A2 word is produced by the encoders 44, 45 and loaded into the A0, A1 and A2 registers.

During the second clock period the data in registers D0 and D1 is output, the C0 and C1 data is shifted into registers D0 and D1, the A0, A1, and A2 data is shifted into B0, B1, and B2 and a new code word is loaded into Level A. At this point, Levels A, B and D contain data.

During the third clock period the data in registers D0 and D1 is output, the data in B0 and B1 is shifted directly into D0 and D1, and thereafter data is shifted down the pipeline in a straightforward manner.

The control of this process is provided by the PROM 48 which receives data information from the Ta and Tb flip-flops and is coupled by control lines to registers C0, C1, D0 and D1 and to multiplexers 49, 50 and 51.

Figure 6A:
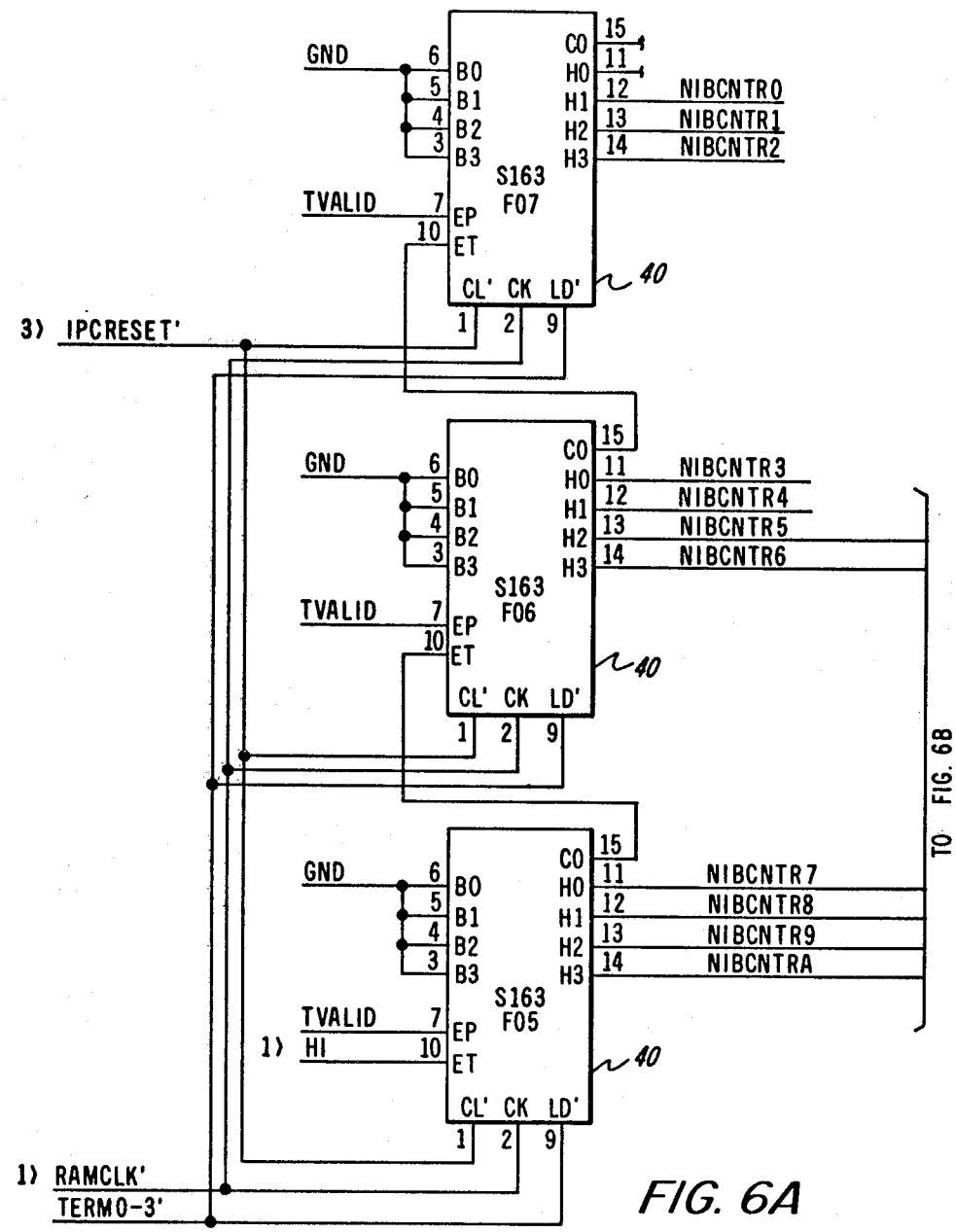
FIGS. 6A, 6B, 6C, 7A, 7B, 8A, 8B and 9 are schematic diagrams of the circuit.
Figure 6B:
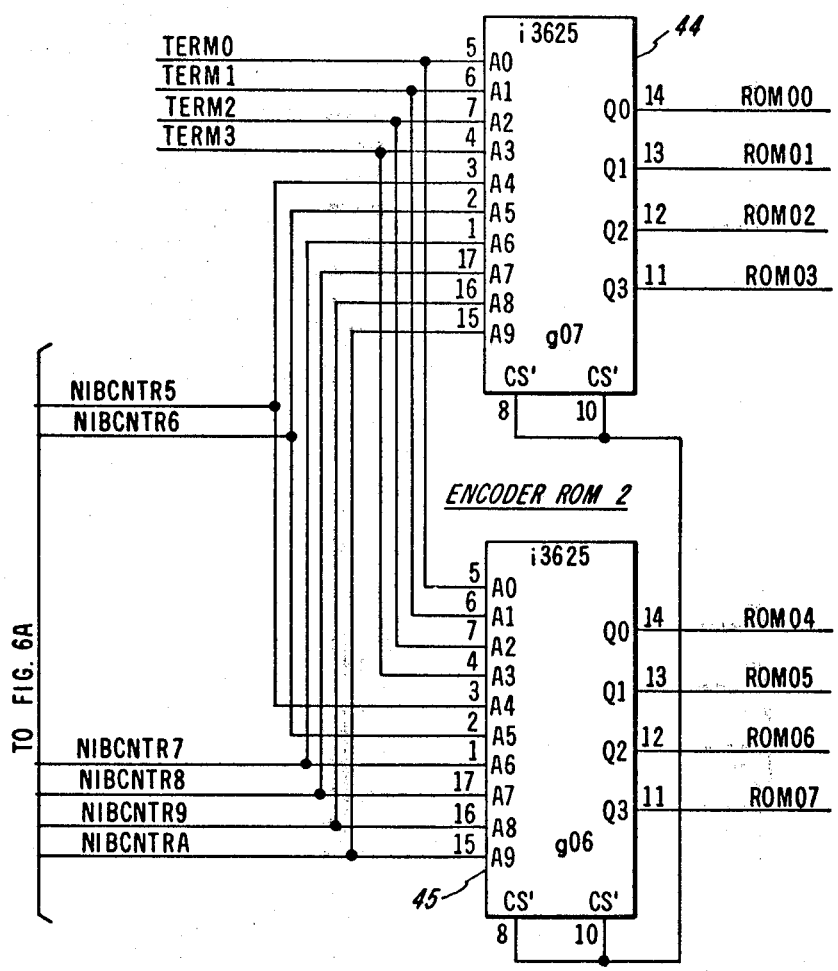
Figure 6C:
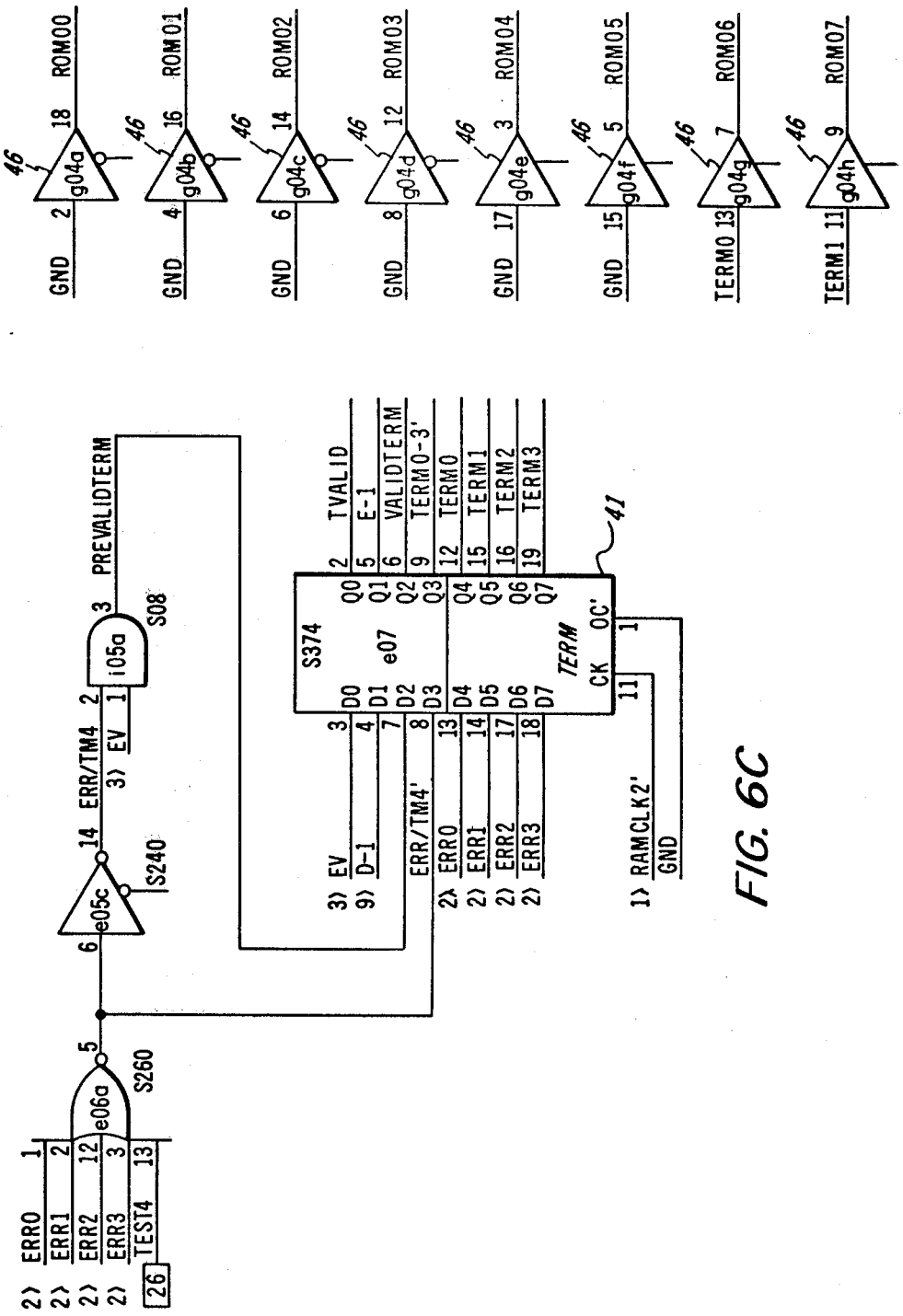

FIGS. 6, 7, 8 and 9 are detailed schematics of the circuit. In FIG. 6, counter devices f07, f06 and f05 comprise the eleven bit counter 40. The six least significant bits are connected as address inputs to ROM devices g07 and g06 which are the encoder PROMs 44, 45.

The terminator register 41 is the lower half of register device e07, and receives the four error inputs Err0-3 from the predictor, said inputs constituting the predicted image data word inputs to this circuit.

The error valid signal, EV, is also buffered through this device e07. The error valid signal, EV, which is buffered through this device e07 represents the difference between the predicted and actual scanned data. The presence of predicted data at the input causes the "Data Valid" flip-flop to be set.

FIG. 6 tri-state devices g04a through g04h are the tri-state devices 46 of FIG. 4 that may be used to inject control codes into the data stream. In the case shown, there is a capability for generating four control codes using the Term 0 and Term 1 lines.

Figure 7A:
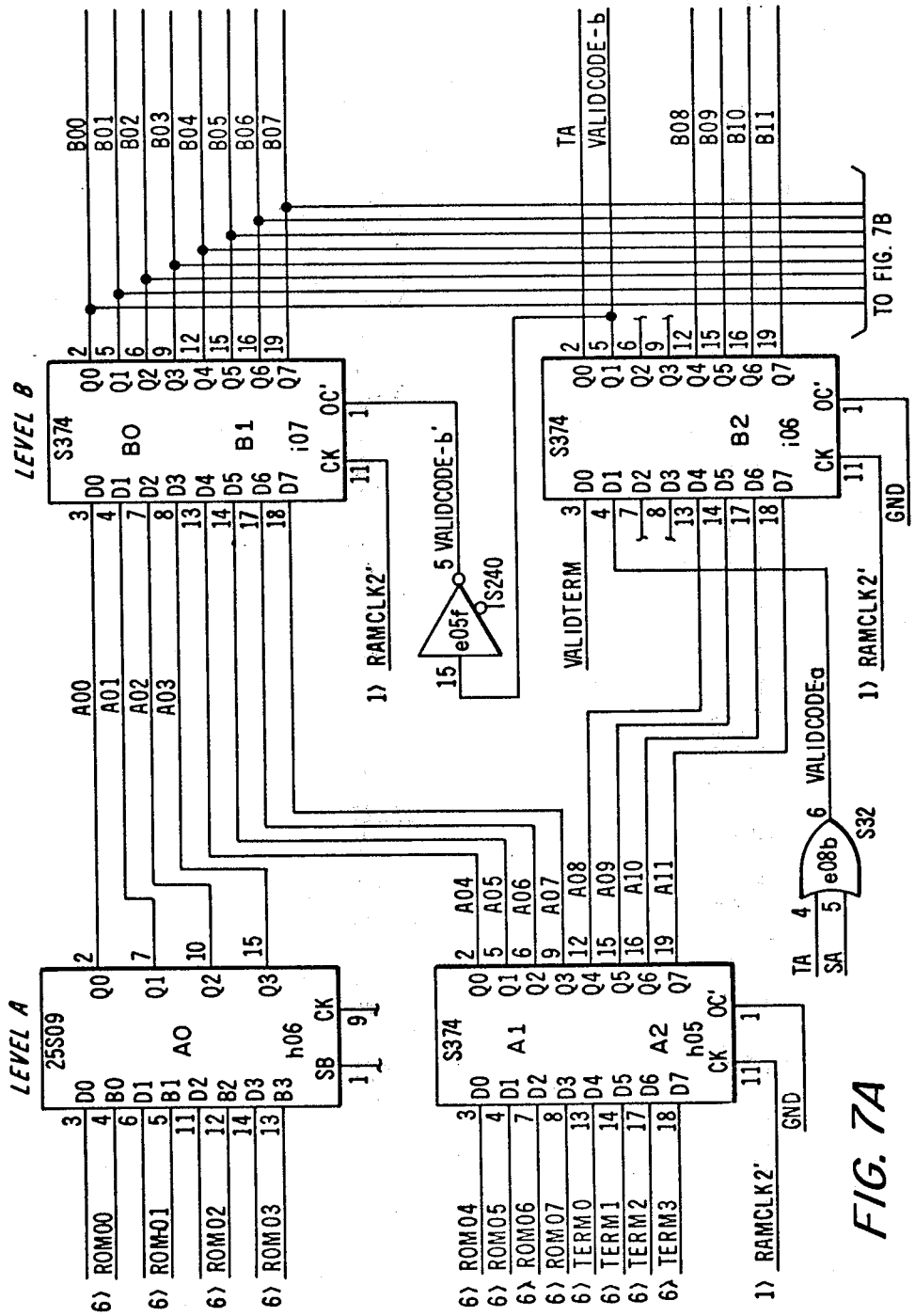
Figure 7B:
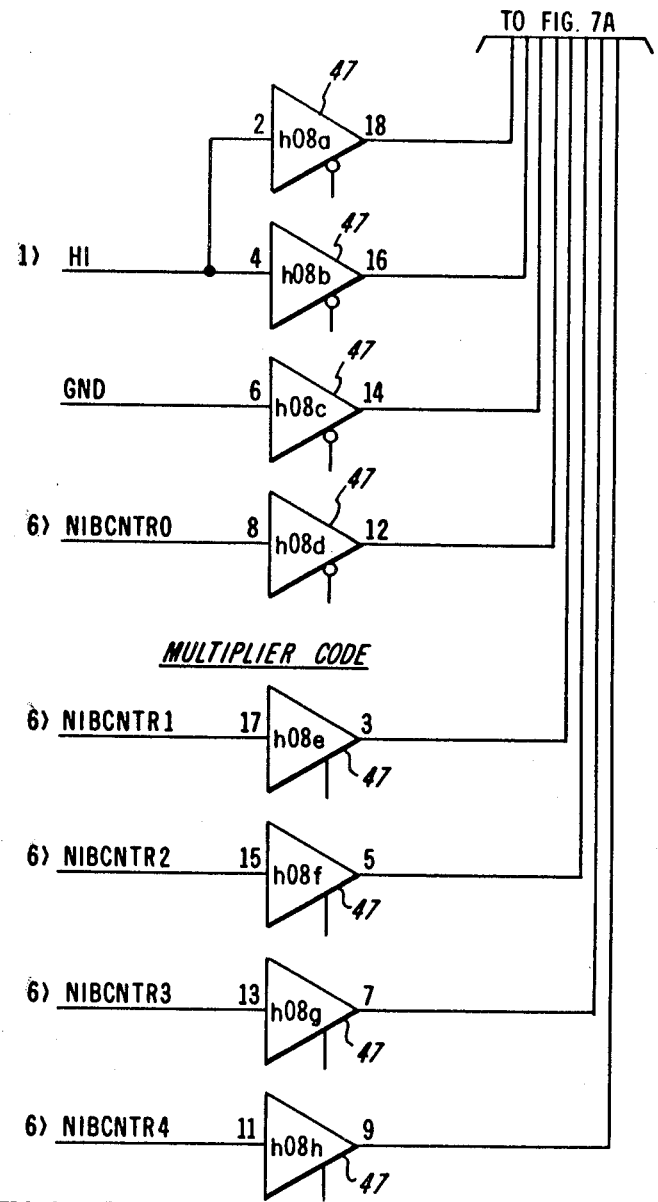
Figure 8A:
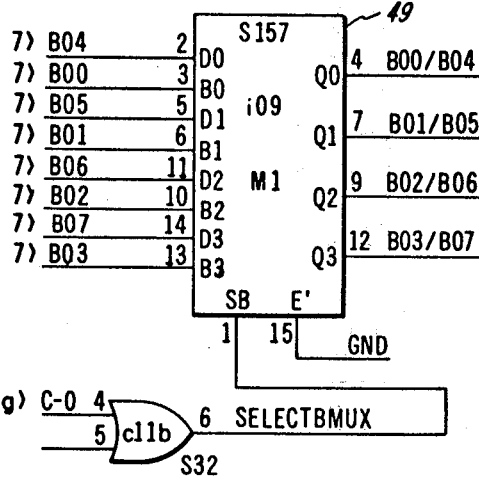
Figure 8A:
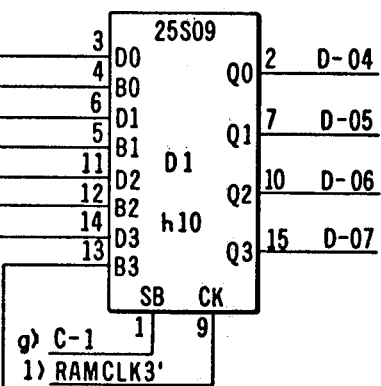
Figure 8A:
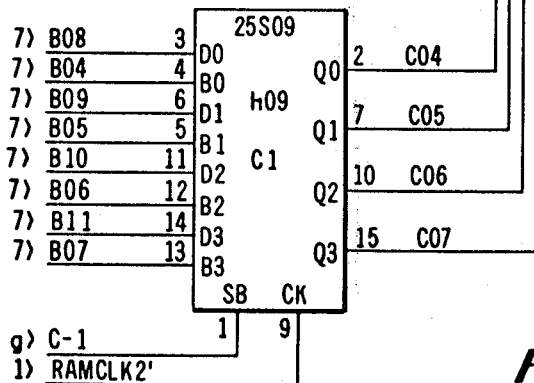
Figure 8B:
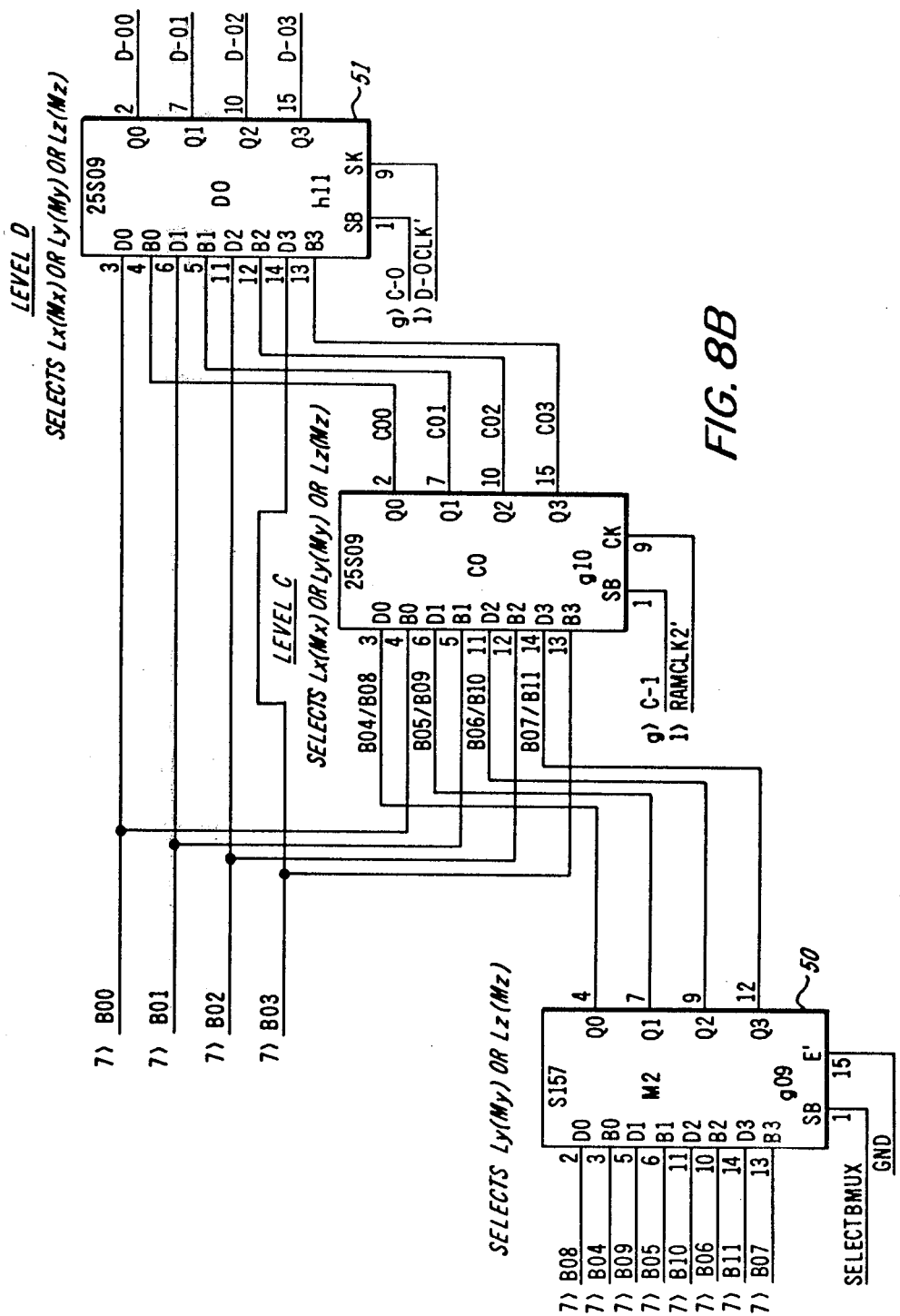

As shown in FIG. 7, the A0, A1 and A2 registers implemented from a multiplexer h06 and a register h05 receive twelve parallel bits of data on the ROM 00 through ROM 07 lines from ROM 1, 44 and ROM 2, 45 memory devices and on lines Term 0 through Term 3 from the terminating register 41. As described above, the next clock pulse will then transfer these twelve bits on lines A00 through A11 to the B0 and B1 registers i07 and B2 register i06.

The tri-state devices 47 of FIG. 4 are shown as devices h08a through h08h and couple the three leading bits (110) of the Type 3B code word and the five most significant counter 40 bits from lines NibCntr0 through NibCntr4 to the B0, B1 and B2 register output lines B00 through B11.

The C0 register, a multiplexing latch g10, is shown in FIG. 8 as receiving data from either the B0 register on lines B00 through B03 or through multiplexer 50 from either the B1 register on lines B04 through B07 or the B2 register on lines B08 through B11. The multiplexer 51 of FIG. 4 and the D0 register are combined into multiplexer/latch device h11 which is labelled as the D0 register, and which receives four bits of data from the B0 register on lines B00 through B03 or from the C0 register on lines C00 through C03.

The C1 register h09 is also a multiplexing latch receiving data from the B1 and B2 registers. Finally, the D1 register h10 receives either C1 register data through lines C04 through C07 or B0 and B1 register data through the M1 multiplexer 49 on lines B00 through B07.

Figure 9:
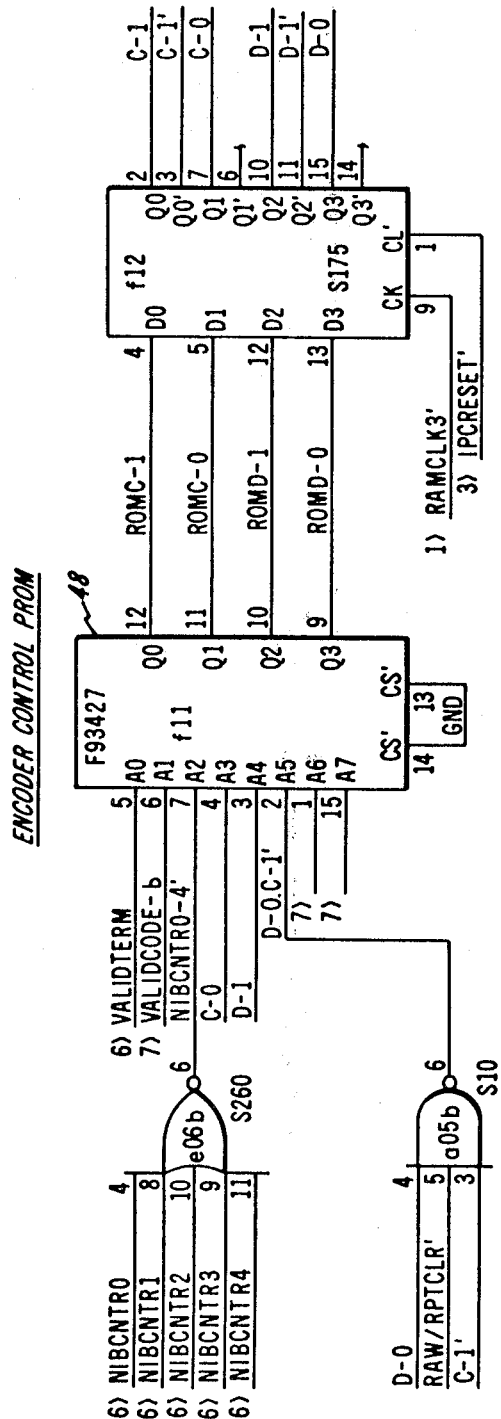

FIG. 9 is a schematic of the encoder PROM 48 circuit of FIG. 4. The NibCntr0-4 signal line is driven by the output of gate e06b which monitors the five most significant bits of the counter 40 to signify whether more than 64 all-zero nibbles have been received and therefore whether a Type 3B code word need be produced. The Valid Term input is a result of the exclusive ORing of the four bits of the latest data input nibble and signifies whether the last nibble is all-zero. Valid Code-b is a function of the bit in the Ta register of FIG. 4 and signifies whether the data in the A Level registers during the previous clock period, and in the B Level registers during the current clock period are valid. These inputs are used as inputs to the encoder control PROM 48 which drives a decoder f12 to produce control signals C-0, C-1, D-0 and D-1 which are used to control the M1 multiplexer 49, the M2 multiplexer 50 and the C0, C1, D0 and D1 registers of FIG. 8.

The invention is not limited to any of the embodiments described above, but all changes and modifications thereof not constituting departures from the spirit and scope of the invention are intended to be covered by the following claims.

What is claimed is:

1. An encoding circuit which receives data to be encoded in four bit nibbles and which produces code words encoding the run length of all-zero nibbles and the terminating pattern, said words being from four to twelve bits in length, in multiples of four bits, comprising
a counter for counting the number of four bit all-zero nibbles preceeding a terminating nibble
an encoder responsive to said count and to the reception of a terminating nibble, for producing a four, eight or twelve bit code word containing a coded run length portion, a coded terminating portion, and a plurality of code bits specifying the length of the code word, and
a packing circuit for packing said code words into a fixed length series of output words.

2. The circuit of claim 1 wherein said fixed length is eight bits per word.

3. The circuit of claim 2 wherein said packing circuit comprises a four level pipeline, the first and second levels being twelve bits wide, the third and fourth levels being eight bits wide, and further comprising multiplexers for coupling data, in four bit nibbles, from any part of said second level into any part of said third and fourth levels, and from the third to the fourth level, so that the code words will be output in eight bit words.

4. The circuit of claim 3 further comprising a control signal generator coupled to said packing circuit for generating control codes and inserting said control codes into the data stream.

5. The circuit of claim 4 further comprising a counter register for encoding and coupling data from the most significant bits of said counter to said packing circuit, and responsive to the reception of a terminating nibble, so that at the reception of a terminating nibble, and when the count is too large to be accomodated by a twelve bit code word, the circuit will produce a twelve bit code word coding the most significant bits of said counter followed by a four, eight or twelve bit code word encoding the least significant bits of said counter and said terminating nibble.

6. The circuit of claim 5 further comprising an additional bit in the first and second levels of said packing circuit for storing a bit indicating whether the data in said first and second levels is valid, and
a control PROM responsive to the contents of said additional bits to control the operation of said multiplexers and said third and fourth levels of said pipeline.

7. The circuit of claim 6 further comprising a terminating register for temporarily storing said terminating nibble, and for coupling said terminating nibble pattern to said encoder and to said first level of said pipeline.

8. The circuit of claim 7 wherein said encoder is a PROM which is addressed by the least significant bits of said counter and by the data in the terminating register.

9. The circuit of claim 8 wherein the eight most significant bits of the first level of said pipeline receive data from said encoder and from said control signal generator, and wherein the four least significant bits receive data from said terminating register.

10. The circuit of claim 9 wherein said counter is an eleven bit counter, the most significant five bits being coupled to said counter register and the remainder coupled to said encoder.

* * * * *